(12) United States Patent
Choi et al.

(10) Patent No.: US 8,679,900 B2
(45) Date of Patent: Mar. 25, 2014

(54) INTEGRATED CIRCUIT PACKAGING SYSTEM WITH HEAT CONDUCTION AND METHOD OF MANUFACTURE THEREOF

(75) Inventors: DaeSik Choi, Seoul (KR); SangMi Park, Pucheon Si (KR); MinJung Kim, Kwang-ju (KR); MinWook Yu, Suwon-si (KR)

(73) Assignee: Stats Chippac Ltd., Singapore (SG)

( * ) Notice: Subject to any disclaimer, the term of this patent is extended or adjusted under 35 U.S.C. 154(b) by 0 days.

(21) Appl. No.: 13/325,530

(22) Filed: Dec. 14, 2011

(65) Prior Publication Data
US 2013/0154085 A1 Jun. 20, 2013

(51) Int. Cl.
*H01L 21/00* (2006.01)

(52) U.S. Cl.
USPC 438/122; 257/718; 257/E21.5; 257/E23.104; 361/718

(58) Field of Classification Search
USPC ............... 438/122; 257/718, E21.5, E23.104; 361/718, 719
See application file for complete search history.

(56) References Cited

U.S. PATENT DOCUMENTS

| | | | |
|---|---|---|---|
| 6,011,304 A | 1/2000 | Mertol | |
| 6,333,460 B1* | 12/2001 | Toy et al. | 174/541 |
| 6,515,360 B2 | 2/2003 | Matsushima et al. | |
| 6,724,080 B1 | 4/2004 | Ooi et al. | |
| 6,856,015 B1* | 2/2005 | Huang et al. | 257/706 |
| 7,009,307 B1 | 3/2006 | Li | |
| 7,211,889 B2 | 5/2007 | Shim | |
| 7,538,421 B2 | 5/2009 | Chen | |
| 8,049,313 B2 | 11/2011 | Foong et al. | |
| 2007/0138651 A1* | 6/2007 | Hauenstein | 257/782 |
| 2007/0145571 A1 | 6/2007 | Lee et al. | |

OTHER PUBLICATIONS

U.S. Appl. No. 13/287,035, filed Nov. 1, 2011, Choi.

\* cited by examiner

*Primary Examiner* — Caridad Everhart
(74) *Attorney, Agent, or Firm* — Ishimaru & Associates LLP

(57) ABSTRACT

A method of manufacture of an integrated circuit packaging system includes: providing a substrate; mounting an integrated circuit over the substrate; mounting a lid base over the substrate, the lid base having a base indentation and a hole with the integrated circuit within the hole; and mounting a heat slug over the lid base, the heat slug having a slug non-horizontal side partially within the base indentation.

2 Claims, 4 Drawing Sheets

INTEGRATED CIRCUIT PACKAGING SYSTEM WITH HEAT CONDUCTION AND METHOD OF MANUFACTURE THEREOF

TECHNICAL FIELD

The present invention relates generally to an integrated circuit packaging system, and more particularly to a system for heat conduction.

BACKGROUND ART

Increased miniaturization of components, greater packaging density of integrated circuits ("ICs"), higher performance, and lower cost are ongoing goals of the computer industry. Semiconductor package structures continue to advance toward miniaturization, to increase the density of the components that are packaged therein while decreasing the sizes of the products that are made therefrom. This is in response to continually increasing demands on information and communication products for ever-reduced sizes, thicknesses, and costs, along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook computers, and so forth. All of these devices continue to be made smaller and thinner to improve their portability. Accordingly, large-scale IC ("LSI") packages that are incorporated into these devices are required to be made smaller and thinner. The package configurations that house and protect LSI require them to be made smaller and thinner as well.

As the integrated circuit technology advances, more circuit cells can be fabricated in a similar die area so that substantially increased functionality can be accomplished on a given integrated circuit die. The added functionality and increase in the number of circuits generally involves a larger amount of power dissipation. The heat is transmitted from one integrated circuit to the other and there is no significant dissipation path other than through the solder ball to the motherboard. The increased heat in the package can significantly reduce the life of the integrated circuits in the package.

Thus, a need still remains for an integrated circuit packaging system providing low cost manufacturing and improved reliability. In view of the ever-increasing need to save costs and improve efficiencies, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a substrate; mounting an integrated circuit over the substrate; mounting a lid base over the substrate, the lid base having a base indentation and a hole with the integrated circuit within the hole; and mounting a heat slug over the lid base, the heat slug having a slug non-horizontal side partially within the base indentation.

The present invention provides an integrated circuit packaging system, including: a substrate; an integrated circuit over the substrate; a lid base over the substrate, the lid base having a base indentation and a hole with the integrated circuit within the hole; and a heat slug over the lid base, the heat slug having a slug non-horizontal side partially within the base indentation.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
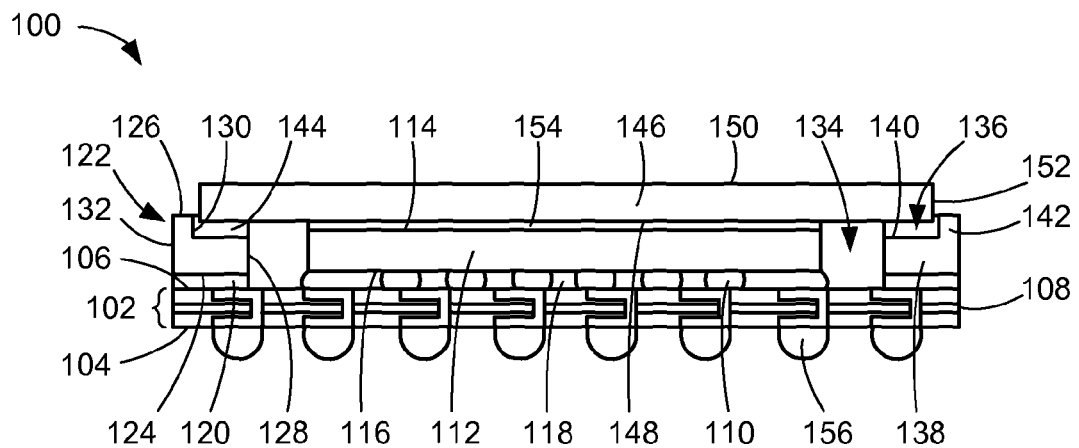
FIG. 1 is a cross-sectional view of an integrated circuit packaging system taken along line 1-1 of FIG. 2 in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane of an active surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" means that there is contact between elements. The term "directly on" means that there is direct contact between one element and another element without an intervening element.

The term "active side" refers to a side of a die, a module, a package, or an electronic structure having active circuitry fabricated thereon or having elements for connection to the active circuitry within the die, the module, the package, or the electronic structure. The term "processing" as used herein includes deposition of material or photoresist, patterning, exposure, development, etching, cleaning, and/or removal of the material or photoresist as required in forming a described structure.

There are problems in current flip chip ball grid array system-in-package with heat spreader packages (fcBGA-SiP-H) with package warpage problems. The package warpage problems can occur with large integrated circuit dies of sizes including 45 millimeters (mm)×45 mm or 55 mm×55 mm, as examples. In addition, there are problems with lack of adhesive coverage and lower adhesion strength between heat slugs and lids in edge area because of the package warpage problems. To prevent these problems, a lot of thermal interface material (TIM) is deposited on lids but cause other problems including tilt and overflow problems because it is difficult to control the thermal interface material. A new lid design is needed to attach heat slugs and lids without these problems. Embodiments of the present invention provide solutions or answers to the problems.

Figure 2:
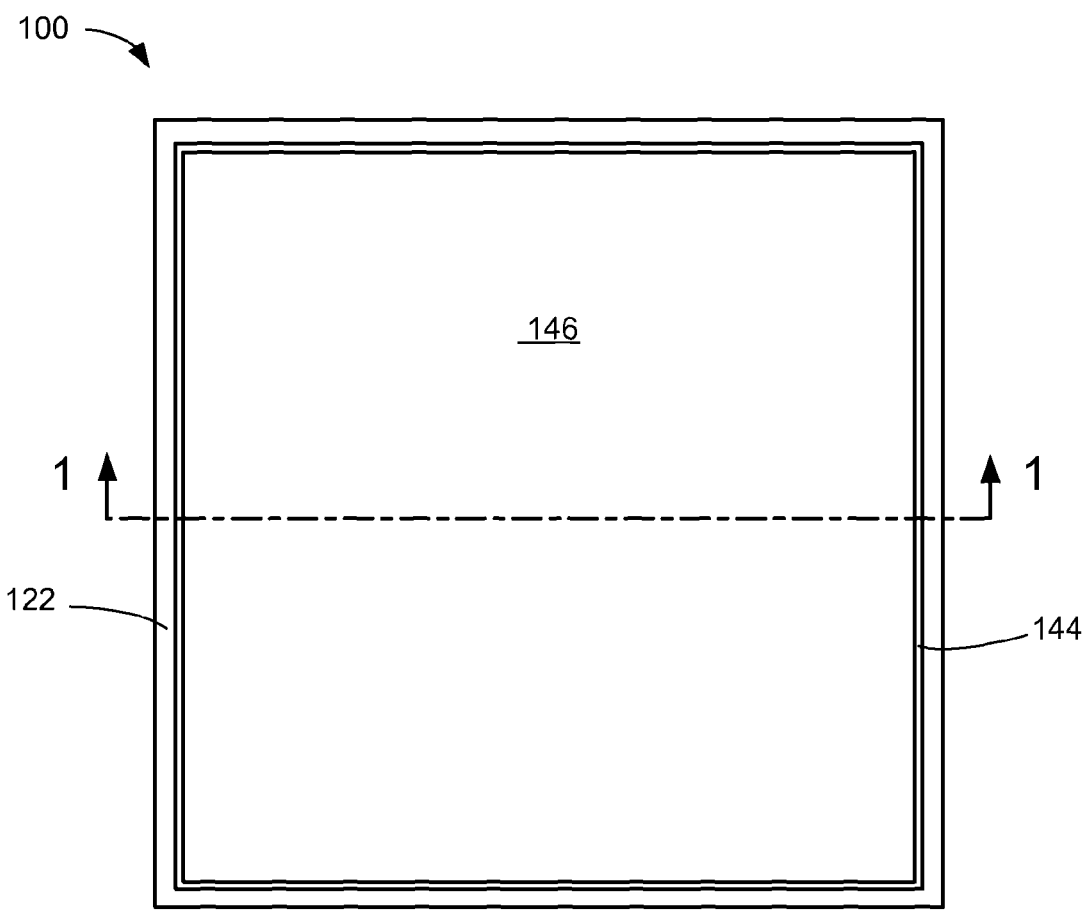
FIG. 2 is a top view of the integrated circuit packaging system.

Referring now to FIG. 1, therein is shown a cross-sectional view of an integrated circuit packaging system 100 taken along line 1-1 of FIG. 2 in a first embodiment of the present invention. The integrated circuit packaging system 100 can include a lid design for heat slug attachment, as an example, in a flip chip ball grid array system-in-package with heat spreader (fcBGA-SiP-H).

The integrated circuit packaging system 100 can include a substrate 102, which is defined as a support structure for mounting and connecting an integrated circuit thereto including providing electrical connections through the support structure. The substrate 102 can include a substrate bottom side 104, a substrate top side 106, and a substrate non-horizontal side 108. The substrate non-horizontal side 108 is defined as a horizontal boundary of the substrate 102.

The integrated circuit packaging system 100 can include internal connectors 110 and an integrated circuit 112 having an inactive side 114 and an active side 116. The internal connectors 110 are defined as electrically conductive connectors. The integrated circuit 112 is defined as a semiconductor device having a number of integrated transistors interconnected to form active circuits. The integrated circuit 112 can represent a semiconductor device including a flip chip.

The integrated circuit 112 can be mounted over the substrate top side 106. The active side 116 can be facing the substrate top side 106. The internal connectors 110 can be attached to the substrate top side 106 and the active side 116.

The integrated circuit packaging system 100 can include an underfill 118, which is defined as a layer of material for providing protection to the internal connectors 110. The underfill 118 can be formed with the layer of material including an underfill (UF) resin material or an epoxy resin. The underfill 118 can be formed directly on the internal connectors 110. The underfill 118 can be filled between the active side 116 and the substrate top side 106.

The integrated circuit packaging system 100 can include a substrate-base adhesive layer 120 and a lid base 122. The substrate-base adhesive layer 120 is defined as a thermally conductive attachment layer. The lid base 122 is defined as a support structure that is used to mount a thermally conductive structure thereon for conducting heat away from a semiconductor device.

The lid base 122 can include a base bottom side 124, a base top side 126, a base lower side 128, a base upper side 130, and a base exterior side 132. The base bottom side 124 and the base top side 126 are defined as bottom and top extents of the lid base 122, respectively. The base lower side 128 and the base upper side 130 are defined as interior surfaces of the lid base 122 that horizontally face away from a periphery of the lid base 122. The base upper side 130 is above the base lower side 128.

The base exterior side 132 is defined as a horizontal extent of the lid base 122 that faces away from the integrated circuit 112. The base exterior side 132 defines an exterior boundary of the lid base 122. The base exterior side 132, a non-horizontal extent of the substrate-base adhesive layer 120, the substrate non-horizontal side 108, or a combination thereof can be coplanar to each other.

The lid base 122 can include a hole 134, which is defined as an opening. The hole 134 can be at a central portion of the lid base 122. The hole 134 can be through the base bottom side 124 and the base top side 126.

The lid base 122 can include a base indentation 136, which is defined as a depression, at the base top side 126. The lid base 122 can include a recess portion 138, which is a portion of the lid base 122 below the base top side 126. The recess portion 138 can include a recess top side 140, which is a top extent of the recess portion 138, below the base top side 126. The lid base 122 can include a step portion 142, which is defined as a portion of the lid base 122 that is above the recess portion 138.

The recess portion 138 can vertically extend from the base bottom side 124 to the recess top side 140. The step portion 142 can vertically extend from the recess top side 140 to the base top side 126.

The recess portion 138 can horizontally extend from the base lower side 128 to the base exterior side 132. The step portion 142 can horizontally extend from the base upper side 130 to the base exterior side 132.

The base indentation 136 can be horizontally between the hole 134 and the step portion 142. The base indentation 136 can be horizontally bounded by the step portion 142 or the base upper side 130. The hole 134 can be horizontally bounded by the recess portion 138 or the base lower side 128.

The integrated circuit packaging system 100 can include a base-slug adhesive layer 144 and a heat slug 146. The base-slug adhesive layer 144 is defined as a thermally conductive attachment layer. The base-slug adhesive layer 144 and the substrate-base adhesive layer 120 can be formed with a thermally conductive material including thermal interface material (TIM).

The heat slug 146 is defined as a thermally conductive structure that conducts heat away from a semiconductor device. The heat slug 146 can include a horizontal width less than a horizontal width of the lid base 122. Horizontal widths of the lid base 122 and the heat slug 146 are defined as distances between non-vertical extents of the lid base 122 and the heat slug 146, respectively.

The heat slug 146 can include a slug bottom side 148, a slug top side 150, and a slug non-horizontal side 152. The slug bottom side 148 and the slug top side 150 are defined as bottom and top extents of the heat slug 146. The slug non-horizontal side 152 is defined as a non-horizontal boundary of the heat slug 146.

The integrated circuit packaging system 100 can include a thermal interface layer 154, which is defined as a structure of a thermally conductive material. The thermal interface layer 154 can conduct heat away from the integrated circuit 112. The thermal interface layer 154 can be formed with a thermally conductive material including thermal interface material (TIM). The heat slug 146 can be mounted over the integrated circuit 112 with the thermal interface layer 154 attached to the inactive side 114 and the slug bottom side 148.

The heat slug 146 can be mounted over the recess top side 140. A portion of the slug non-horizontal side 152 can be vertically within the base indentation 136. The base-slug adhesive layer 144 can be within the base indentation 136. The base-slug adhesive layer 144 can be attached to a portion of the slug bottom side 148 that is within the base indentation 136, directly over the recess top side 140, and facing the recess top side 140.

The base-slug adhesive layer 144 can be attached to or directly on a portion of the slug non-horizontal side 152 that is within the base indentation 136 and facing the base upper side 130. The base-slug adhesive layer 144 can be attached to or directly on the base upper side 130 and the recess top side 140.

The integrated circuit packaging system 100 can include external connectors 156, which are defined as electrically conductive connectors. The external connectors 156 can be attached to the substrate bottom side 104. The external connectors 156 can represent electrically conductive connectors including conductive bumps or conductive balls. For example, the external connectors 156 can be formed with an electrically conductive material including solder, a metallic material, or a metal alloy.

It has been discovered that the lid base 122 having the base indentation 136 provides improved reliability without yield loss since the base-slug adhesive layer 144 is contained within the base indentation 136 resulting in improved adhesion strength between the lid base 122 and the heat slug 146 to meet a specification of a minimum adhesive coverage requirement of adhesive coverage of 80.0% whereas conventional methods have the problems with lack of adhesive coverage and lower adhesion strength that result in at most 74.0% of adhesive coverage based on C-Mode Scanning Acoustic Microscope (C-SAM) inspection report using 10 samples.

It has also been discovered that the lid base 122 having the recess portion 138 and the step portion 142 provides improved reliability by eliminating overflow of the base-slug adhesive layer 144 on the base exterior side 132 with the step portion 142 functioning as a dam to contain the base-slug adhesive layer 144 when an increased volume of the base-slug adhesive layer 144 is used to compensate for height differences at sides of a semiconductor package to solve the package warpage problems and the tilt and overflow problems resulting in elimination of interfacial anomalies, including poor bonding, delamination, voids, openings, or gaps, between the lid base 122 and the heat slug 146.

It has further been discovered that the lid base 122 and the heat slug 146 provided as a two-piece heat slug structure instead of a one-piece heat structure provide improved reliability with the base-slug adhesive layer 144 attached to the lid base 122 and the heat slug 146 to eliminate the interfacial anomalies as well as to withstand pressure of the heat slug 146 exerted upon the integrated circuit 112 by changing lid design instead of flip chip design change.

It has further been discovered that the substrate-base adhesive layer 120 provides improved reliability by providing mechanical and environmental protection with a hermetically seal between the lid base 122 and the substrate 102.

It has further been discovered that the base upper side 130 and the recess top side 140 provide improved reliability since the base upper side 130 and the recess top side 140 provide increase contact surface area for the base-slug adhesive layer 144 to adhere thereto resulting in improved adhesion strength even with package warpage.

It has further been discovered that the substrate-base adhesive layer 120 and the base-slug adhesive layer 144 provide improved reliability by conducting heat away from the integrated circuit 112 through the heat slug 146 and the lid base 122 with the substrate-base adhesive layer 120 and the base-slug adhesive layer 144 having improved heat characteristic.

It has further been discovered that the thermal interface layer 154 provides improved reliability by providing improved adhesion strength with adhesive coverage of at least 95%, which meets a specification of a minimum adhesive coverage requirement of adhesive coverage of 80.0% based on C-Mode Scanning Acoustic Microscope (C-SAM) inspection report using 10 samples.

Referring now to FIG. 2, therein is shown a top view of the integrated circuit packaging system 100. The top view depicts the heat slug 146 attached to the lid base 122 with the base-slug adhesive layer 144. The heat slug 146 can include a surface area less than a surface area of the lid base 122.

Figure 3:
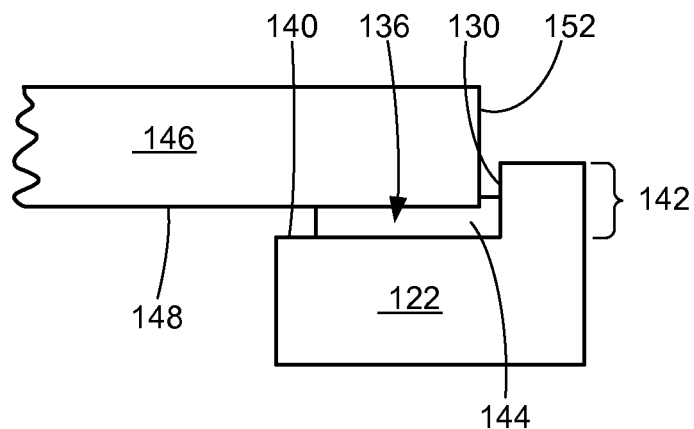
FIG. 3 is a detailed cross-sectional view of the lid base and a portion of the heat slug.

Referring now to FIG. 3, therein is shown a detailed cross-sectional view of the lid base 122 and a portion of the heat slug 146. The detailed cross-sectional view depicts the portion of the heat slug 146 within the base indentation 136.

The base-slug adhesive layer 144 can be attached to a portion of the slug bottom side 148 that is directly over the recess top side 140. The base-slug adhesive layer 144 can be attached to a portion of the slug non-horizontal side 152 that is facing the base upper side 130.

The base upper side 130 or the step portion 142 can contain or enclose the base-slug adhesive layer 144. The base upper side 130 or the step portion 142 can function as a dam to prevent overflow of the base-slug adhesive layer 144.

Figure 4:
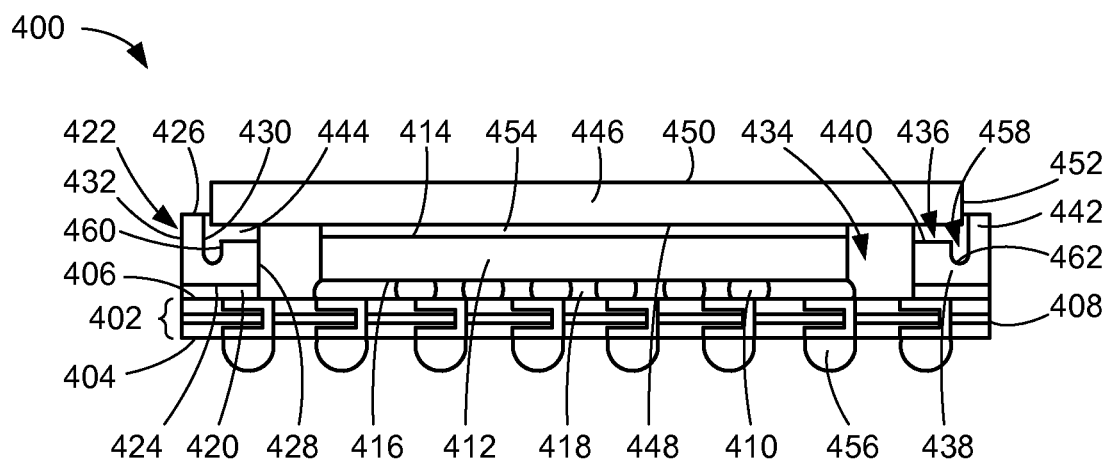
FIG. 4 is a cross-sectional view of an integrated circuit packaging system in a second embodiment of the present invention.

Referring now to FIG. 4, therein is shown a cross-sectional view of an integrated circuit packaging system 400 in a second embodiment of the present invention. In a manner similar to the integrated circuit packaging system 100 of FIG. 1, the integrated circuit packaging system 400 includes a substrate 402 having a substrate bottom side 404, a substrate top side 406, and a substrate non-horizontal side 408.

In a manner similar to the integrated circuit packaging system 100, the integrated circuit packaging system 400 includes internal connectors 410 and an integrated circuit 412 having an inactive side 414 and an active side 416. In a manner similar to the integrated circuit packaging system 100, the integrated circuit packaging system 400 includes an underfill 418 and a substrate-base adhesive layer 420.

In a manner similar to the integrated circuit packaging system 100, the integrated circuit packaging system 400 includes a lid base 422 having a base bottom side 424, a base top side 426, a base lower side 428, a base upper side 430, a base exterior side 432, a hole 434, a base indentation 436, a recess portion 438 with a recess top side 440, and a step portion 442. In a manner similar to the integrated circuit packaging system 100, the integrated circuit packaging system 400 includes a base-slug adhesive layer 444.

In a manner similar to the integrated circuit packaging system 100, the integrated circuit packaging system 400 includes a heat slug 446 having a slug bottom side 448, a slug top side 450, and a slug non-horizontal side 452. In a manner similar to the integrated circuit packaging system 100, the integrated circuit packaging system 400 includes a thermal interface layer 454 and external connectors 456.

The integrated circuit packaging system 400 can include the lid base 422 as another lid design application. The lid base 422 can include the recess portion 438 with a cavity 458, which is defined as an indentation. The cavity 458 can be at the recess top side 440 and below the base indentation 436. The recess portion 438 can include a cavity non-horizontal side 460 and a cavity bottom side 462. The base-slug adhesive layer 444 can be within the cavity 458. The base-slug adhesive layer 444 can be directly on the cavity non-horizontal side 460 and the cavity bottom side 462.

The cavity non-horizontal side 460 is defined as an interior surface of the recess portion 438 that horizontally bounds the cavity 458. The cavity bottom side 462 is defined as an interior surface of the recess portion 438 that vertically bounds the cavity 458. A plane of a portion of the cavity non-horizontal side 460 can be coplanar with a plane of the base upper side 430. The cavity non-horizontal side 460 can vertically extend from the recess top side 440 to the cavity bottom side 462. The cavity non-horizontal side 460 can be connected to the base upper side 430.

It has been discovered that the lid base 422 having the base indentation 436 provides improved reliability without yield loss since the base-slug adhesive layer 444 is contained within the base indentation 436 resulting in improved adhesion strength between the lid base 422 and the heat slug 446 to meet a specification of a minimum adhesive coverage requirement of adhesive coverage of 80.0% whereas conventional methods result in at most 74.0% of adhesive coverage based on C-Mode Scanning Acoustic Microscope (C-SAM) inspection report using 10 samples.

It has also been discovered that the lid base 422 having the recess portion 438 and the step portion 442 provides improved reliability by eliminating overflow of the base-slug adhesive layer 444 on the base exterior side 432 with the step portion 442 functioning as a dam to contain the base-slug adhesive layer 444 when an increased volume of the base-slug adhesive layer 444 is used to compensate for height differences at sides of a semiconductor package due to package warpage resulting in elimination of interfacial anomalies, including lack of bonding, delamination, voids, openings, or gaps, between the lid base 422 and the heat slug 446 due to package warpage.

It has further been discovered that the lid base 422 and the heat slug 446 provided as a two-piece heat slug structure instead of a one-piece heat structure provide improved reliability with the base-slug adhesive layer 444 attached to the lid base 422 and the heat slug 446 to eliminate the interfacial anomalies as well as to withstand pressure of the heat slug 446 exerted upon the integrated circuit 412 by changing lid design instead of flip chip design change.

It has further been discovered that the substrate-base adhesive layer 420 provides improved reliability by providing mechanical and environmental protection with a hermetically seal between the lid base 422 and the substrate 402.

It has further been discovered that the base upper side 430 and the recess top side 440 provide improved reliability since the base upper side 430 and the recess top side 440 provide increase contact surface area for the base-slug adhesive layer 444 to adhere thereto resulting in improved adhesion strength even with package warpage.

It has further been discovered that the substrate-base adhesive layer 420 and the base-slug adhesive layer 444 provide improved reliability by conducting heat away from the integrated circuit 412 through the heat slug 446 and the lid base 422 with the substrate-base adhesive layer 420 and the base-slug adhesive layer 444 having improved heat characteristic.

It has further been discovered that the cavity 458 provides improved reliability with the base-slug adhesive layer 444 contained within the cavity 458 providing improved adhesion strength resulting in elimination of gaps between the lid base 422 and the heat slug 446.

It has further been discovered that the thermal interface layer 454 provides improved reliability by providing improved adhesion strength with adhesive coverage of at least 95%, which meets a specification of a minimum adhesive coverage requirement of adhesive coverage of 80.0% based on C-Mode Scanning Acoustic Microscope (C-SAM) inspection report using 10 samples.

Figure 5:
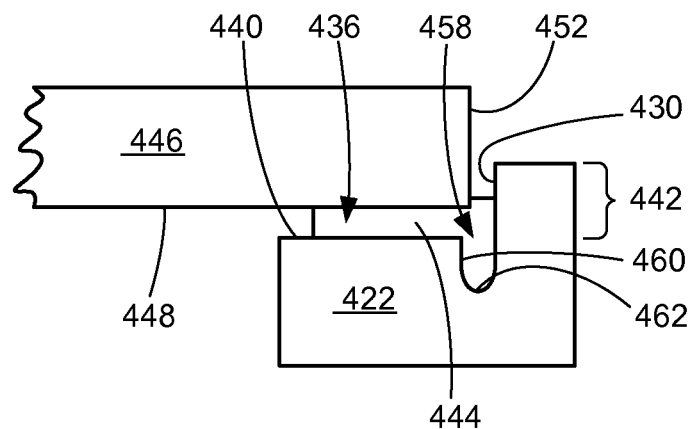
FIG. 5 is a detailed cross-sectional view of the lid base and a portion of the heat slug.

Referring now to FIG. 5, therein is shown a detailed cross-sectional view of the lid base 422 and a portion of the heat slug 446. The detailed cross-sectional view depicts the portion of the heat slug 446 within the base indentation 436.

The base-slug adhesive layer 444 can be attached to a portion of the slug bottom side 448 that is directly over the recess top side 440. The base-slug adhesive layer 444 can be attached to a portion of the slug non-horizontal side 452 that is facing the base upper side 430. The base-slug adhesive layer 444 can be within the cavity 458. The base-slug adhesive layer 444 can be attached to the cavity non-horizontal side 460 and the cavity bottom side 462.

The base upper side 430 or the step portion 442 can contain the base-slug adhesive layer 444. The base upper side 430 or the step portion 442 can function as a dam to prevent overflow of the base-slug adhesive layer 444.

Figure 6:
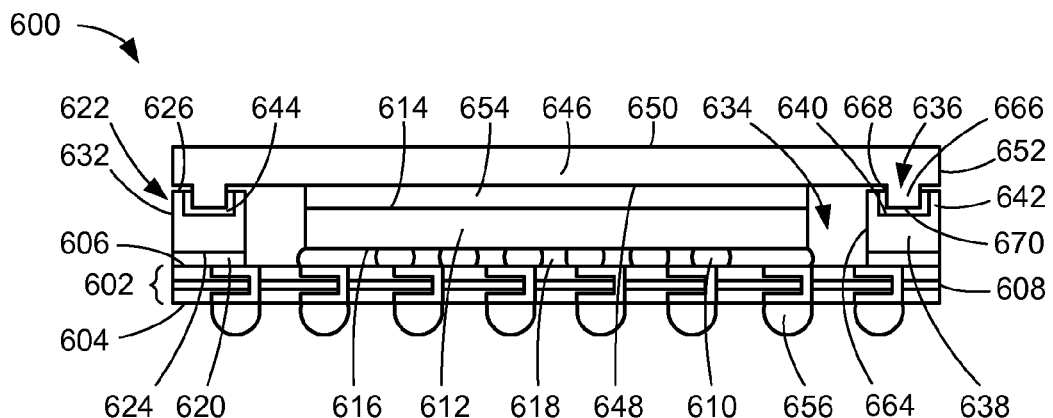
FIG. 6 is a cross-sectional view of an integrated circuit packaging system in a third embodiment of the present invention.

Referring now to FIG. 6, therein is shown a cross-sectional view of an integrated circuit packaging system 600 in a third embodiment of the present invention. In a manner similar to the integrated circuit packaging system 100 of FIG. 1, the integrated circuit packaging system 600 includes a substrate 602 having a substrate bottom side 604, a substrate top side 606, and a substrate non-horizontal side 608.

In a manner similar to the integrated circuit packaging system 100, the integrated circuit packaging system 600 includes internal connectors 610 and an integrated circuit 612 having an inactive side 614 and an active side 616. In a manner similar to the integrated circuit packaging system 100, the integrated circuit packaging system 600 includes an underfill 618 and a substrate-base adhesive layer 620.

In a manner similar to the integrated circuit packaging system 100, the integrated circuit packaging system 600 includes a lid base 622 having a base bottom side 624, a base top side 626, a base exterior side 632, a hole 634, a base indentation 636, a recess portion 638 with a recess top side 640, and a step portion 642. In a manner similar to the integrated circuit packaging system 100, the integrated circuit packaging system 600 includes a base-slug adhesive layer 644.

In a manner similar to the integrated circuit packaging system 100, the integrated circuit packaging system 600 includes a heat slug 646 having a slug bottom side 648, a slug top side 650, and a slug non-horizontal side 652. In a manner similar to the integrated circuit packaging system 100, the integrated circuit packaging system 600 includes a thermal interface layer 654 and external connectors 656.

The integrated circuit packaging system 600 can include the lid base 622 and the heat slug 646 as another heat slug and lid design application. The lid base 622 can include a base interior side 664, which is defined as a non-horizontal extent of the lid base 622 that faces the integrated circuit 612.

The base interior side 664 can extend from the base bottom side 624 to the base top side 626. The base interior side 664 can horizontally bound the hole 634. The base indentation 636 can be between the base interior side 664 and the base exterior side 632. The base exterior side 632 can be coplanar with the slug non-horizontal side 652.

The slug bottom side 648 of the heat slug 646 is defined as a surface of the heat slug 646 that is lower than the slug top side 650. The heat slug 646 can include a slug protrusion 666, which is defined as a portion of the heat slug 646 that vertically extends from the slug bottom side 648.

The slug protrusion 666 can include a protrusion non-horizontal side 668 and a protrusion bottom side 670. The protrusion non-horizontal side 668 is defined as a non-horizontal extent of the slug protrusion 666. A portion of the protrusion non-horizontal side 668 and the protrusion bottom side 670 can be within the base indentation 636.

The protrusion non-horizontal side 668 can intersect the slug bottom side 648 and the protrusion bottom side 670. The protrusion bottom side 670 is defined as a bottom extent of the slug protrusion 666. The protrusion bottom side 670 can be below the slug bottom side 648.

The base-slug adhesive layer 644 can be attached to a portion of the slug protrusion 666. The base-slug adhesive layer 644 can be directly on the protrusion bottom side 670 and a portion of the protrusion non-horizontal side 668 that are within the base indentation 636.

It has been discovered that the lid base 622 having the base indentation 636 provides improved reliability without yield loss since the base-slug adhesive layer 644 is contained within the base indentation 636 resulting in improved adhesion strength between the lid base 622 and the heat slug 646 to meet a specification of a minimum adhesive coverage requirement of adhesive coverage of 80.0% whereas conventional methods result in at most 74.0% of adhesive coverage based on C-Mode Scanning Acoustic Microscope (C-SAM) inspection report using 10 samples.

It has also been discovered that the lid base 622 having the recess portion 638 and the step portion 642 provides improved reliability by eliminating overflow of the base-slug adhesive layer 644 on the base exterior side 632 with the step portion 642 functioning as a dam to contain the base-slug adhesive layer 644 when an increased volume of the base-slug adhesive layer 644 is used to compensate for height differences at sides of a semiconductor package due to package warpage resulting in elimination of interfacial anomalies, including poor bonding, delamination, voids, openings, or gaps, between the lid base 622 and the heat slug 646 due to package warpage.

It has further been discovered that the lid base 622 and the heat slug 646 provided as a two-piece heat slug structure instead of a one-piece heat structure provide improved reliability with the base-slug adhesive layer 644 attached to the lid base 622 and the heat slug 646 to eliminate the interfacial anomalies as well as to withstand pressure of the heat slug 646 exerted upon the integrated circuit 612 by changing lid design instead of flip chip design change.

It has further been discovered that the substrate-base adhesive layer 620 provides improved reliability by providing mechanical and environmental protection with a hermetically seal between the lid base 622 and the substrate 602.

It has further been discovered that the recess top side 640 provides improved reliability since the recess top side 640 provides increase contact surface area for the base-slug adhesive layer 644 to adhere thereto resulting in improved adhesion strength even with package warpage.

It has further been discovered that the substrate-base adhesive layer 620 and the base-slug adhesive layer 644 provide improved reliability by conducting heat away from the integrated circuit 612 through the heat slug 646 and the lid base 622 with the substrate-base adhesive layer 620 and the base-slug adhesive layer 644 having improved heat characteristic.

It has further been discovered that the slug protrusion 666 provides improved reliability with the protrusion non-horizontal side 668 and the protrusion bottom side 670 provide increased contact surface area for the base-slug adhesive layer 644 to adhere thereto thereby increasing adhesion between the lid base 622 and the heat slug 646.

It has further been discovered that the thermal interface layer 654 provides improved reliability by providing improved adhesion strength with adhesive coverage of at least 95%, which meets a specification of a minimum adhesive coverage requirement of adhesive coverage of 80.0% based on C-Mode Scanning Acoustic Microscope (C-SAM) inspection report using 10 samples.

Figure 7:
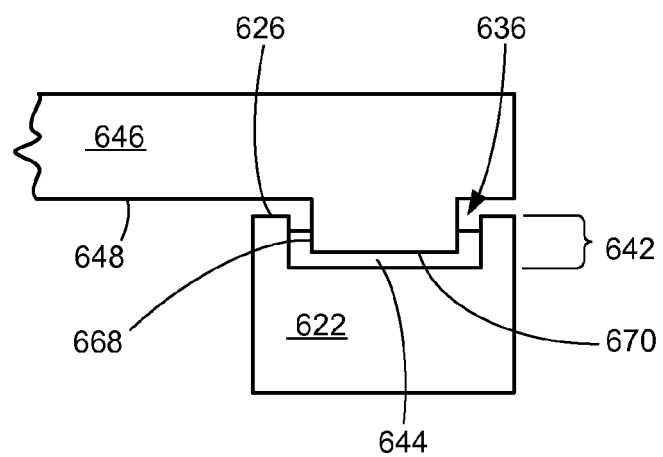
FIG. 7 is a detailed cross-sectional view of the lid base and a portion of the heat slug.

Referring now to FIG. 7, therein is shown a detailed cross-sectional view of the lid base 622 and a portion of the heat slug 646. The detailed cross-sectional view depicts the portion of the heat slug 646 within the base indentation 636.

The base-slug adhesive layer 644 can be attached to a portion of the protrusion non-horizontal side 668. The base-slug adhesive layer 644 can be attached to the protrusion bottom side 670. The base-slug adhesive layer 644 can be within the base indentation 636.

The step portion 642 can enclose or contain the base-slug adhesive layer 644. The step portion 642 can function as a dam to prevent overflow of the base-slug adhesive layer 644.

For illustration purposes, the slug bottom side 648 is shown above and away from the base top side 626, although it is understood that the slug bottom side 648 can be at any position over the base top side 626. For example, the slug bottom side 648 can be directly on the base top side 626.

Figure 8:
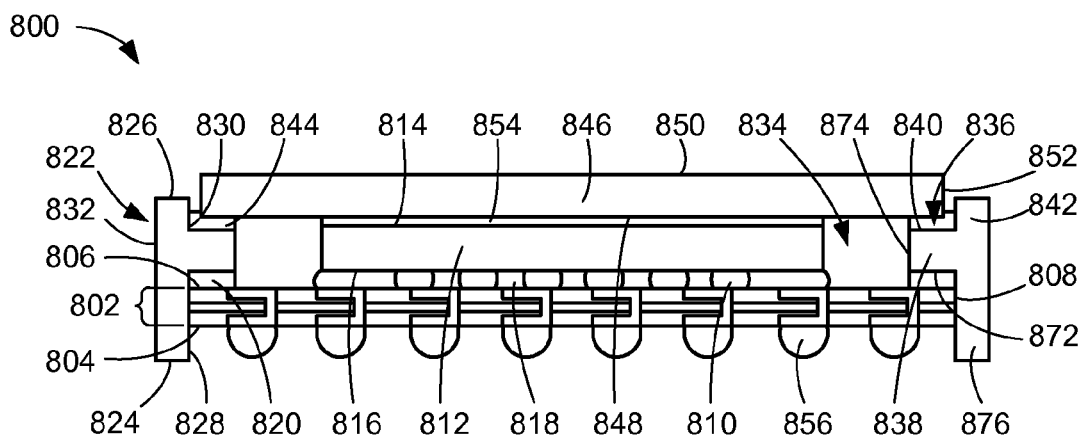
FIG. 8 is a cross-sectional view of an integrated circuit packaging system in a fourth embodiment of the present invention.

Referring now to FIG. 8, therein is shown a cross-sectional view of an integrated circuit packaging system 800 in a fourth embodiment of the present invention. In a manner similar to the integrated circuit packaging system 100 of FIG. 1, the integrated circuit packaging system 800 includes a substrate 802 having a substrate bottom side 804, a substrate top side 806, and a substrate non-horizontal side 808.

In a manner similar to the integrated circuit packaging system 100, the integrated circuit packaging system 800 includes internal connectors 810 and an integrated circuit 812 having an inactive side 814 and an active side 816. In a manner similar to the integrated circuit packaging system 100, the integrated circuit packaging system 800 includes an underfill 818 and a substrate-base adhesive layer 820.

In a manner similar to the integrated circuit packaging system 100, the integrated circuit packaging system 800 includes a lid base 822. The lid base 822 can include a base bottom side 824, which is defined as a bottom extent of the lid base 822. In a manner similar to the lid base 122 of FIG. 1, the lid base 822 includes a base top side 826. The lid base 822 can include a base lower side 828, which is defined as an interior surface of the lid base 122 that horizontally faces away from a periphery of the lid base 122.

In a manner similar to the lid base 122, the lid base 822 includes a base upper side 830, a base exterior side 832, a hole 834, a base indentation 836, and a recess portion 838 with a recess top side 840, and a step portion 842. The base upper side 830 and the base lower side 828 can be coplanar to each other.

In a manner similar to the integrated circuit packaging system 100, the integrated circuit packaging system 800 includes a base-slug adhesive layer 844. In a manner similar to the integrated circuit packaging system 100, the integrated circuit packaging system 800 includes a heat slug 846 having a slug bottom side 848, a slug top side 850, and a slug non-horizontal side 852. In a manner similar to the integrated circuit packaging system 100, the integrated circuit packaging system 800 includes a thermal interface layer 854 and external connectors 856.

The recess portion 838 can include a recess bottom side 872 and a recess non-horizontal side 874. The recess bottom side 872 is defined as a bottom extent of the recess portion 838. The recess non-horizontal side 874 is defined as a non-horizontal extent of the recess portion 838. The recess non-horizontal side 874 can be facing away from the base lower side 828 and the base upper side 830.

The lid base 822 can include a leg portion 876, which is defined as a portion of the lid base 822 that provides support for the lid base 822. The leg portion 876 can be below the recess portion 838 and the step portion 842. The leg portion 876 can vertically extend from the recess bottom side 872. The leg portion 876 can be horizontally bounded by the base lower side 828 and the base exterior side 832. The leg portion 876 can be vertically bounded by the base bottom side 824.

The substrate-base adhesive layer 820 can be attached to the recess bottom side 872 and a portion of the base lower side 828. A portion of the base lower side 828 can be directly on the substrate non-horizontal side 808.

The leg portion 876 can extend from the base bottom side 824 to the recess bottom side 872. A portion of the leg portion 876 can be below or protruding from the substrate bottom side 804 providing spacing for the external connectors 856. A portion of the leg portion 876 that vertically protrudes from the substrate bottom side 804 can include a vertical height greater than or approximately equal to vertical heights of the external connectors 856.

It has been discovered that the lid base 822 having the base indentation 836 provides improved reliability without yield loss since the base-slug adhesive layer 844 is contained within the base indentation 836 resulting in improved adhesion strength between the lid base 822 and the heat slug 846 to meet a specification of a minimum adhesive coverage requirement of adhesive coverage of 80.0% whereas conventional methods result in at most 74.0% of adhesive coverage based on C-Mode Scanning Acoustic Microscope (C-SAM) inspection report using 10 samples.

It has also been discovered that the lid base 822 having the recess portion 838 and the step portion 842 provides improved reliability by eliminating overflow of the base-slug adhesive layer 844 on the base exterior side 832 with the step portion 842 functioning as a dam to contain the base-slug adhesive layer 844 when an increased volume of the base-slug adhesive layer 844 is used to compensate for height differences at sides of a semiconductor package due to package warpage resulting in elimination of interfacial anomalies, including poor bonding, delamination, voids, openings, or gaps, between the lid base 822 and the heat slug 846 due to package warpage.

It has further been discovered that the lid base 822 and the heat slug 846 provided as a two-piece heat slug structure instead of a one-piece heat structure provide improved reliability with the base-slug adhesive layer 844 attached to the lid base 822 and the heat slug 846 to eliminate the interfacial anomalies as well as to withstand pressure of the heat slug 846 exerted upon the integrated circuit 812 by changing lid design instead of flip chip design change.

It has further been discovered that the substrate-base adhesive layer 820 provides improved reliability by providing mechanical and environmental protection with a hermetically seal between the lid base 822 and the substrate 802.

It has further been discovered that the base upper side 830 and the recess top side 840 provide improved reliability since the base upper side 830 and the recess top side 840 provide increase contact surface area for the base-slug adhesive layer 844 to adhere thereto resulting in improved adhesion strength even with package warpage.

It has further been discovered that the substrate-base adhesive layer 820 and the base-slug adhesive layer 844 provide improved reliability by conducting heat away from the integrated circuit 812 through the heat slug 846 and the lid base 822 with the substrate-base adhesive layer 820 and the base-slug adhesive layer 844 having improved heat characteristic.

It has further been discovered that the leg portion 876 provides improved reliability with the leg portion 876 protruding from the substrate bottom side 804 providing spacing for the external connectors 856 thereby eliminating collapse of the external connectors 856.

It has further been discovered that the thermal interface layer 854 provides improved reliability by providing improved adhesion strength with adhesive coverage of at least 95%, which meets a specification of a minimum adhesive coverage requirement of adhesive coverage of 80.0% based on C-Mode Scanning Acoustic Microscope (C-SAM) inspection report using 10 samples.

Figure 9:
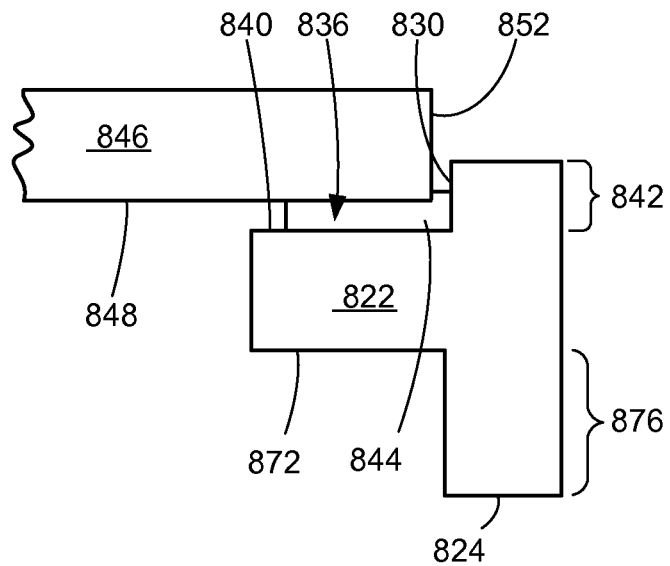
FIG. 9 is a detailed cross-sectional view of the lid base and the heat slug.

Referring now to FIG. 9, therein is shown a detailed cross-sectional view of the lid base 822 and the heat slug 846. The detailed cross-sectional view depicts the portion of the heat slug 846 within the base indentation 836.

The base-slug adhesive layer 844 can be attached to a portion of the slug bottom side 848 that is directly over the recess top side 840. The base-slug adhesive layer 844 can be attached to a portion of the slug non-horizontal side 852 that is facing the base upper side 830.

The base upper side 830 or the step portion 842 can contain the base-slug adhesive layer 844. The base upper side 830 or the step portion 842 can function as a dam to prevent overflow of the base-slug adhesive layer 844. The leg portion 876 can extend from the base bottom side 824 to the recess bottom side 872.

Figure 10:
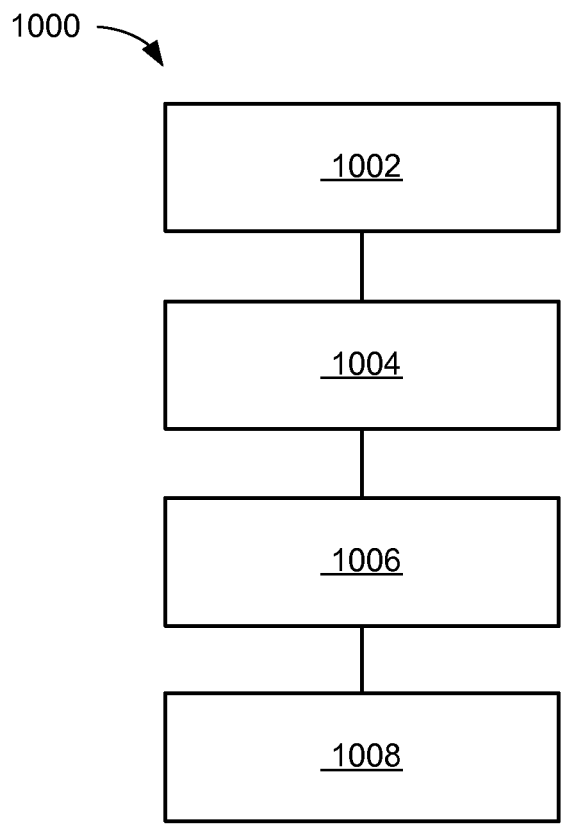
FIG. 10 is a flow chart of a method of manufacture of the integrated circuit packaging system in a further embodiment of the present invention.

Referring now to FIG. 10, therein is shown a flow chart of a method 1000 of manufacture of the integrated circuit packaging system 100 in a further embodiment of the present invention. The method 1000 includes: providing a substrate in a block 1002; mounting an integrated circuit over the substrate in a block 1004; mounting a lid base over the substrate, the lid base having a base indentation and a hole with the integrated circuit within the hole in a block 1006; and mounting a heat slug over the lid base, the heat slug having a slug non-horizontal side partially within the base indentation in a block 1008.

Thus, it has been discovered that the integrated circuit packaging system of the present invention furnishes important and heretofore unknown and unavailable solutions, capabilities, and functional aspects for an integrated circuit packaging system with heat conduction. The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   providing a substrate;
   mounting an integrated circuit over the substrate;
   mounting a lid base over the substrate, the lid base having:
      a base indentation and a hole with the integrated circuit within the hole,
      a cavity below the base indentation, and
      a leg portion, wherein a first leg portion is below a substrate bottom side of the substrate and a second leg portion is directly on a substrate non-horizontal side of the substrate;
   attaching a thermal interface layer to the integrated circuit;
   attaching a base-slug adhesive layer to the lid base, the base-slug adhesive layer within the cavity; and
   mounting a heat slug directly on the thermal interface layer over the integrated circuit, the heat slug having:
      a slug non-horizontal side partially within the base indentation, and
      a slug bottom side with the base-glue adhesive layer directly on portions of the slug non-horizontal side and the slug bottom side.

2. The method as claimed in claim 1 wherein mounting the heat slug includes mounting the heat slug having a slug protrusion, the slug protrusion extending from the slug bottom side and partially within the base indentation.

* * * * *